United States Patent [19]

Rees

[11] Patent Number: 5,721,508
[45] Date of Patent: Feb. 24, 1998

[54] 5 VOLT TOLERANT 3.3 VOLT OUTPUT BUFFER

[75] Inventor: David Brian Rees, Basingstoke, United Kingdom

[73] Assignee: Cypress Semiconductor Corporation, San Jose, Calif.

[21] Appl. No.: 590,588

[22] Filed: Jan. 24, 1996

[51] Int. Cl.$^6$ ..................................................... H03K 17/16
[52] U.S. Cl. ..................... 327/382; 327/316; 327/108; 326/81; 326/21; 326/87
[58] Field of Search ........................... 327/379, 380–382, 327/378, 108, 111, 112, 315, 316, 318, 319, 323, 309, 310, 327, 328; 326/63, 68, 82, 83, 87, 81, 21, 27

[56] References Cited

U.S. PATENT DOCUMENTS

| 5,004,936 | 4/1991 | Andresen | 326/87 |
| 5,570,043 | 10/1996 | Churchill | 326/81 |

*Primary Examiner*—Timothy P. Callahan
*Assistant Examiner*—Eunja Shin
*Attorney, Agent, or Firm*—Bliss McGlynn, P.C.

[57] ABSTRACT

Circuit for preventing the improper functioning of a CMOS output buffer that may occur due to the fact that since the output buffer P-channel may be coupled between a supply voltage and an output pad. If the pad is driven higher than the supply voltage by an external source, current may be injected into the parasitic diodes of the source/drain of the transistor.

9 Claims, 1 Drawing Sheet

5 VOLT TOLERANT 3.3 VOLT OUTPUT BUFFER

BACKGROUND OF THE INVENTION

1. Field of the Invention

The present invention relates to integrated circuit CMOS technology and more particularly to a method and means for preventing a massive current injection into an integrated circuit when any of its pads is taken to a voltage higher than positive power supply on the chip by an external source.

2. Prior Art

A typical CMOS output buffer in an N-well integrated circuit uses a P-channel pullup transistor, MP1. In such circuits, if the output pad is driven higher than VCC by an external source, then current may be injected into the parasitic PN diodes of the source/drain of transistor MP1. Also, MP1 will be switched ON if a $V_{gs}>V_{Tp}$ condition is created. $V_{gs}$=voltage applied between the gate and the source of the transistor, $V_{Tp}$=threshold voltage of the P-channel transistor, i.e., the voltage level which, if applied, just turns on the transistor. These phenomena pose a hazard to circuit operation since excessive currents may result and, in the first instance, large amounts of current in the N-well may cause latchup, while, in the second instance, the driving device will see an apparent short circuit to VCC which may cause it to malfunction.

Problem to be Solved

It is therefore a problem in the art as to how to prevent a massive current injection by an external source into a CMOS chip by an over-voltage on the source or drain of any P-channel transistor in the output buffer of an integrated circuit which is directly or indirectly connected to the output pad.

Objects

It is accordingly an object of the present invention to provide a method and means for preventing the injection of excessive current from an external source into a CMOS chip.

It is another an object of the invention to utilize associated circuitry to provide a 5 volt tolerant 3.3 volt CMOS output buffer.

It is a further object of the invention to provide an excessive current preventing method and means for CMOS output buffers, with minimal impact on die size and on speed through the output buffer when operating normally.

SUMMARY OF THE INVENTION

The present invention involves the utilization of associated circuitry for preventing the improper functioning of the output buffer in a CMOS circuit. Such problematic functioning can occur due to the fact that since the output buffer P-channel transistor, MP1, is coupled between the VCC power supply and the output pad, if the pad is driven higher than VCC by an applied external source, current may be injected into the parasitic PN diodes of the source/drain of the transistor MP1. Also, MP1 will be switched ON if a $V_{gs}>V_{Tp}$ condition is created. These conditions can cause a massive injection of current flow into the CMOS chip defeating the function of the output buffer. Similar conditions may occur for any P-channel transistor connected directly or indirectly to the output pad causing current injections which must be prevented.

In accordance with the invention these conditions are prevented, firstly, by the provision of a pair of P-channel transistors, MP2, MP3, whose gates are respectively driven by the pad voltage and VCC and with their sources oppositely connected to these voltages, and having their drains and also their substrates connected, in common with the output buffer transistor MP1, to the otherwise isolated N-well (Node $N_3$), so as to couple the N-well to either VCC or the pad, depending on whichever is at the higher voltage. This arrangement prevents the parasitic source/drain diodes of MP1 (and also MP2 and MP3) from becoming forward biased and thus avoids current injection into the N-well and hence to the chip's VCC supply. Further, to avoid the turning ON of MP1, a voltage detect circuit is formed by a P-channel transistor, MP4, and an N-channel transistor, MN4, both having their gates driven by VCC (or a reference voltage), and having their drains coupled to a node N1, the voltage V1 of which is always low unless the pad is driven above VCC whereupon it follows the pad voltage. When the voltage V1 follows the high pad voltage, it is coupled, through suitable inverters, to the gate of one P-channel transistor MP5, of a transistor pair that couples VCC to the gate of MP1, causing the gate of MP5 to go high thus turning it OFF and hence cutting off the other transistor MP6 (and hence VCC) from the gate voltage V2 of the buffer transistor MP1 to which the drain of MP5 is connected. The inverse of V1 is connected to the gate of MN9 and will turn MN9 OFF thus disconnecting V2 from the transistor MN8 which may or may not be on. At the same time, a P-channel transistor MP7, whose gate is driven by VCC or a reference voltage and which is connected between V2 and the pad, will be turned ON and hence will connect V2 to the pad voltage ensuring that there is never a $V_{gs}>V_{Tp}$ across MP1 and thus that MP1 will not turn ON. All P-channel transistors connected directly or indirectly to the pad have their substrates connected to the node $N_3$.

BRIEF DESCRIPTION OF THE DRAWING

The present invention will be described in more detail below with reference to the accompanying drawing in which.

DETAILED DESCRIPTION OF THE PREFERRED EMBODIMENT

Figure 1:
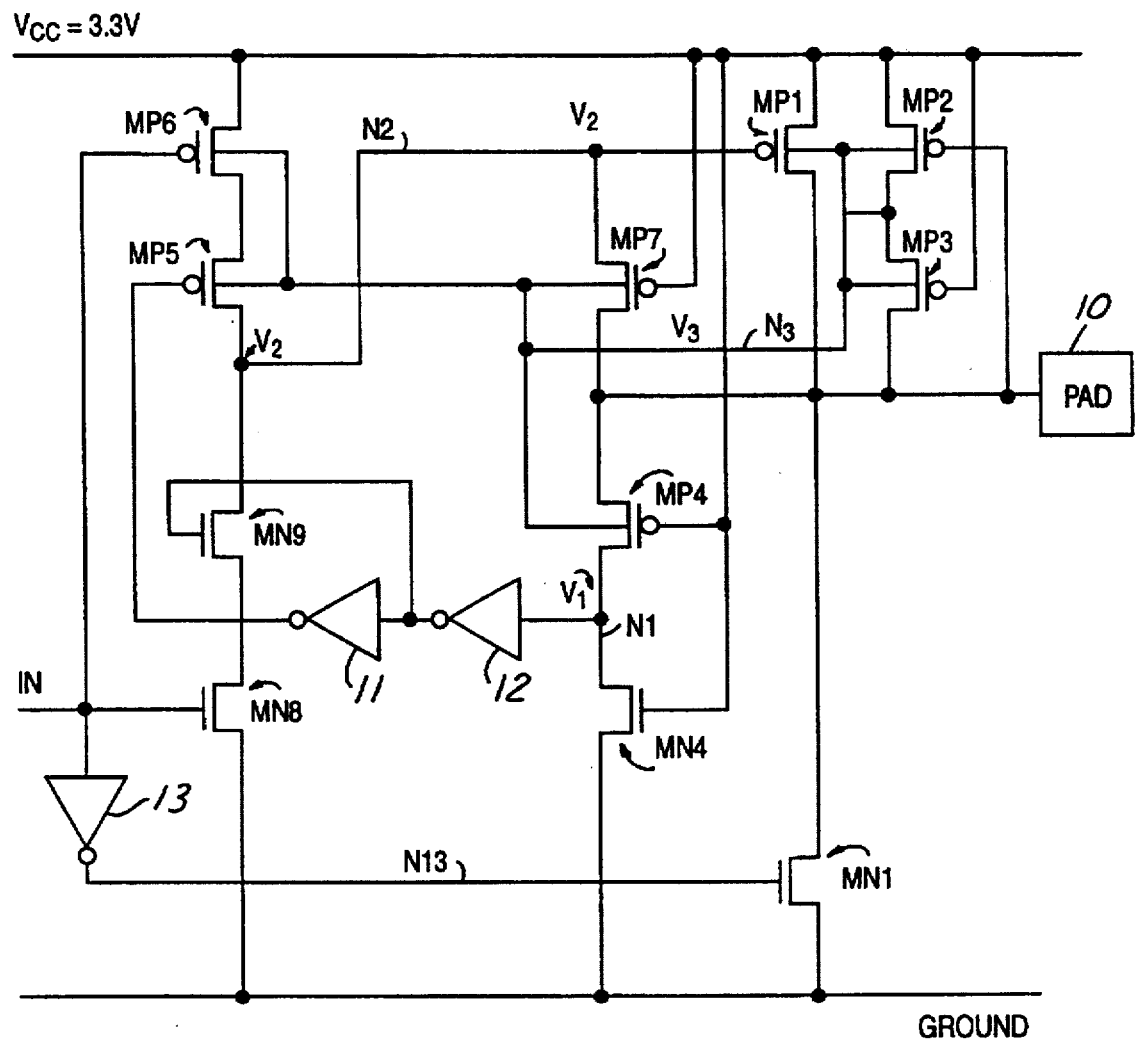
FIG. 1 is a schematic diagram of an N-well CMOS circuit including an output buffer P-channel pullup transistor MP1 and associated circuitry in accordance with the invention for preventing the injection of excessive current from an external source into the CMOS chip.

An N-well CMOS circuit on a CMOS chip is illustrated in FIG. 1 with an output buffer P-channel pullup transistor MP1 that is coupled between supply voltage VCC and an output pad 10. The substrate connection of transistor MP1 is tied to the N-well voltage V3 and the source is connected to VCC. It is controlled by a driving voltage V2 on its gate and has its drain coupled to ground through an N-channel transistor MN1. In accordance with the invention, paired transistors MP2 and MP3, whose gates are driven respectively by the pad voltage and VCC and having their sources oppositely connected to these voltages, are connected across MP1. These transistors have their drains connected in common to the N-well, N3, to connect the N well to either VCC or the pad 10, whichever is at the higher voltage. The pad 10 is also connected to a P-channel transistor MP4 and an N-channel transistor MN4 pair, whose gates are driven by VCC (although another reference voltage could be used), and form a voltage detect circuit that drives the voltage V1, at node N1, connected to their drains. This voltage (V1) is normally low, but is coupled to the pad 10 voltage by MP4 when the pad 10 voltage is driven above VCC. The voltage V1 at node N1 is buffered by a pair of inverters, 11 and 12, and applied to the gate of a P-channel transistor MP5, which with P-channel transistor MP6 forms a transistor pair connected between supply voltage VCC and the voltage V2, on node N2, that drives the gate of the output buffer pullup transistor MP1. In normal operation, transistors MP5 and MP6 when ON cause voltage V2 on the gate of MN1 to go to VCC thus maintaining MP1 OFF. A P-channel transistor MP7 is connected between node N2, at voltage V2, and pad 10 and has its gate driven by VCC. In normal operation, MP7 is OFF. The input voltage, IN, drives transistor MP6 and an N-channel transistor MN8 which couples MP5 to ground, and, through inverter 13, N-channel transistor MN1, which is paired with MP1 between VCC and ground and which drive the pad 10. The inverter 13 is used only in this example to aid understanding of the circuit. In a real application, it would be replaced by a more complex circuit which would allow N13 to be controlled separately from the node IN. It will be seen and understood that all transistors with sources or drains connected to the pad 10 or node N2, which are P-channel type, must have their substrate connections tied to the N-well voltage V3 (node N3).

In operation, because output buffer P-channel pullup transistor MP1 is coupled between supply voltage VCC (which may be 3.3 volts) and the output pad 10, if the pad 10 is driven higher than VCC (e.g., to about 5 volts), by an applied external source, current may be injected into the parasitic PN diodes of the source/drain of MP1. This condition can cause massive current flow into the chip defeating the proper function of the output buffer. To avoid this phenomenon, in accordance with the invention, the N well, N3, is coupled to either VCC or the pad 10, whichever is at the higher voltage, by the paired transistors MP2 and MP3 that are connected across MP1, thus preventing the parasitic source/drain diodes of MP1 from becoming forward biased. Higher voltages of the order of 5 volts may then be applied to the pad without adversely effecting current flow in the circuit.

Further, the voltage detect circuit formed by the P-channel transistor MP4 and N-channel transistor MN4 pair cause node N1 voltage V1, which is normally low, to follow the voltage on the pad 10 when it is driven above VCC. The voltage V1, at node N1, buffered by the pair of inverters, 11 and 12, is applied to the gate of P-channel transistor MP5, so that, when V1 goes high, MP5 is switched OFF decoupling P-channel transistor MP6 and voltage VCC from voltage V2, on node N2, that drives the gate of output buffer pullup transistor MP1. The inverse of V1 is connected to the gate of MN9 which decouples V2 from ground irrespective of the state of the signal IN. Also when the pad voltage is driven above VCC, the P-channel transistor MP7, whose gate is driven by VCC or a reference voltage and is coupled between node N2 and the pad 10, will be turned ON and will connect N2 (V2) to the pad voltage thus ensuring that there is never a $V_{gs} > V_{Tp}$ across MP1 and therefore that MP1 will not turn ON. Again, a higher voltage than VCC (e.g., 5 volts) may be applied without damaging the CMOS circuit or the external source of the higher voltage.

It is assumed that while the external source is driving the pad that the input voltage IN is high so that both MP1 and its paired N-channel transistor MN1 are normally OFF, i.e., the output pad 10 is tristated. (Although the inverter 13 is only used to aid understanding of the circuit.) The circuits will also work if MP1 is ON and MN1 is OFF, i.e., the output pad is pulled to a logic "1"=VCC.

The process may have wells of the N-type or N-type and P-type. In this case, similar well control circuits may be used providing the well can be isolated from the substrate.

It will be seen that a circuit arrangement is presented for a 5 volt tolerant 3.3 volt output circuit that prevents massive current injection into a CMOS chip and which has minimal impact on die size and on speed through the output buffer when operating normally.

While the present invention has been described in terms of specific embodiments and combinations, it will be appreciated that the invention is not limited to the particular examples presented herein, that those of skill in the art may readily implement alternative forms in the light of the examples, and that the scope of the protection is defined in the attached claims.

I claim:

1. A circuit comprising:
   a first pair of transistors of a first channel type connected across an output buffer transistor in a well of a second and complementary channel type, said first pair of transistors each having gates driven respectively by the voltage of an output pad and a supply voltage and each having sources oppositely connected to said pad voltage and said supply voltage, and each having drains commonly connected to said well for coupling either said output pad voltage or said supply voltage, whichever is at the higher voltage, to said well, configured to prevent the parasitic source/drain diodes of said output buffer transistors from becoming forward biased;
   a second pair of transistors each having gates driven by said supply voltage, one of said second pair of transistors having a source connected to the drain of said output buffer transistor and the other of said second pair of transistors having a source connected to ground, each of said second pair of transistors having a drain connected to a common node;
   a third pair of transistors of said first channel type tied to said well and connected between said supply voltage and the gate of said output buffer transistor, a first one of said third transistors having a source connected to said supply voltage and its gate coupled to an input voltage and the other one of said third pair of transistors having a drain connected to the gate of output buffer transistor and its gate coupled to said common node such that when the voltage from said output pad exceeds said supply voltage said third pair of transistors decouple said supply voltage and the gate of said output buffer transistor; and
   a coupling transistor of said first channel type coupled to said well and having (i) a gate driven by said supply voltage, (ii) a source connected to said output pad voltage and (iii) a drain connected to said gate of said output buffer transistor such that when said output pad voltage exceeds said supply voltage said coupling transistor is turned ON.

2. The circuit of claim 8 wherein said first pair of transistors are P-channel type and said are N-channel type of P-channel type and N-channel type.

3. A circuit for preventing the flow of excessive current from an external source into a CMOS chip having an output pad and a supply voltage, comprising:
   an output buffer transistor coupled between said supply voltage and said output pad;
   a first pair of transistors, connected across said output buffer transistor and of a channel type the same as said output buffer transistor and opposite that of the circuit well, said pair of transistors having their gates driven respectively by the voltage of said output pad and said supply voltage and having their sources oppositely connected to said pad voltage and said supply voltage, and with their drains commonly connected to said circuit well for coupling either said output pad voltage or said supply voltage, whichever is at the higher voltage, to said circuit well, whereby the parasitic source/drain diodes of said output buffer transistor are prevented from becoming forward biased;

a second pair of transistors having their gates driven by said supply voltage or a reference voltage, one of which has its source connected to the drain of said output buffer transistor and said output pad voltage and the other of which has its source connected to ground, and both of which have their drains connected in common to a node;

a third pair of transistors of the same channel type tied to said circuit well and connected between said supply voltage and the gate of said output buffer transistor, one having its source connected to said supply voltage and with its gate coupled to an input voltage and the other having its drain connected to the gate of said output buffer transistor and with its gate coupled to said node so that when the voltage from said output pad exceeds said supply voltage said third pair of transistors decouple said supply voltage and the gate of said output buffer transistor; and a coupling transistor of the same channel type as said third pair of transistors, tied to said circuit well and driven by said supply voltage or a reference voltage having its source connected to said output pad voltage and its drain connected to said gate of said output buffer transistor such that when said output pad voltage exceeds said supply voltage said coupling transistor is turned ON coupling said output pad voltage to said gate of said output buffer transistor, whereby there is never a $V_{gs} > V_{Tp}$ across said output buffer transistor and therefore it will not turn ON.

4. A method for preventing the flow of excessive current from an external source into a CMOS chip having an output pad and a supply voltage VCC, comprising the steps of:

coupling an output buffer transistor between said supply voltage and said output pad;

connecting a first pair of transistors across said output buffer transistor, that are of a channel type the same as said output buffer transistor and opposite that of the circuit well, and having their gates driven respectively by the voltage of said output pad and said supply voltage and having their sources oppositely connected to said pad voltage and said supply voltage, and with their drains commonly connected to said circuit well for coupling either said output pad voltage or said supply voltage, whichever is at the higher voltage, to said circuit well, whereby the parasitic source/drain diodes of said output buffer transistor are prevented from becoming forward biased;

connecting a second pair of transistors having their gates driven by said supply voltage or a reference voltage, one with its source to the drain of said output buffer transistor and said output pad voltage and the other with its source to ground, and both with their drains connected to common to a node;

tying a third pair of transistors of the same channel type to said circuit well and connecting them between said supply voltage and the gate of said output buffer transistor, one having its source connected to said supply voltage and its gate coupled to an input voltage and the other having its drain connected to the gate of said output buffer transistor and with its gate coupled to said node so that when the voltage from said output pad exceeds said supply voltage said third pair of transistors decouple said supply voltage and the gate of said output buffer transistor; and tying a coupling transistor of the same channel type as said third pair of transistors to said circuit well, driving it with said supply voltage or a reference voltage, and connecting its source to said output pad voltage and its drain to said gate of said output buffer transistor such that when said output pad voltage exceeds said supply voltage said coupling transistor is turned ON coupling said output pad voltage to said gate of said output buffer transistor, whereby there is never a $V_{gs} > V_{Tp}$ across said output buffer transistor and therefore it will not turn ON.

5. The circuit according to claim 1 further comprising inverter means for coupling the drain of said other of said third pair of transistors to said common node.

6. The circuit according to claim 1 wherein said supply voltage comprises a reference voltage.

7. The circuit according to claim 1 wherein said output pad voltage is coupled to said gate of said output buffer transistor via the coupling transistor such that said output buffer transistor does not turn ON.

8. The circuit according to claim 1 wherein said circuit prevents the flow of excessive current from an external source to said well.

9. The circuit according to claim 1 wherein one of said second pair of transistors is of said first channel type.

* * * * *